(12) United States Patent
Ohori et al.

(10) Patent No.: US 11,404,279 B2
(45) Date of Patent: Aug. 2, 2022

(54) ETCHING METHOD AND SUBSTRATE PROCESSING APPARATUS

(71) Applicant: Tokyo Electron Limited, Tokyo (JP)

(72) Inventors: Takahiro Ohori, Miyagi (JP); Taiki Miura, Miyagi (JP); Masahiro Ogasawara, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/997,199

(22) Filed: Aug. 19, 2020

(65) Prior Publication Data
US 2021/0057229 A1 Feb. 25, 2021

(30) Foreign Application Priority Data
Aug. 21, 2019 (JP) .............................. JP2019-151424

(51) Int. Cl.
| | | |
|---|---|---|
| *H01L 21/311* | (2006.01) | |
| *H01L 21/3065* | (2006.01) | |
| *H01J 37/32* | (2006.01) | |
| *H01L 21/3213* | (2006.01) | |

(52) U.S. Cl.
CPC .. *H01L 21/31116* (2013.01); *H01J 37/32082* (2013.01); *H01J 37/32449* (2013.01); *H01L 21/3065* (2013.01); *H01L 21/32137* (2013.01); *H01J 2237/334* (2013.01)

(58) Field of Classification Search
CPC . G06F 15/16; H04B 7/18523; H04B 7/18578; H04L 12/189; H04L 12/5692; H04L 29/06; H04L 67/2842; H01J 2237/334; H01J 37/32082; H01J 37/32449; H01J 37/32146; H01L 21/3065; H01L 21/31116; H01L 21/32137; H01L 21/32138; H01L 21/308; H01L 21/67069; H01L 21/3081; H01L 21/32136; H01L 21/31144
USPC ....... 438/706, 710, 712, 714, 717, 719, 720, 438/723, 736; 156/345.24, 345.26
See application file for complete search history.

(56) References Cited

U.S. PATENT DOCUMENTS

| | | | |
|---|---|---|---|
| 6,905,800 B1* | 6/2005 | Yuen | G03F 7/427 134/1.2 |
| 2002/0072016 A1* | 6/2002 | Chen | H01L 21/32136 430/323 |
| 2004/0025791 A1* | 2/2004 | Chen | H01J 37/32706 118/728 |
| 2013/0048606 A1* | 2/2013 | Mao | G03F 1/82 216/67 |
| 2013/0092655 A1* | 4/2013 | Yu | B82Y 40/00 216/41 |
| 2015/0064914 A1* | 3/2015 | Kong | H01L 21/0332 438/696 |
| 2018/0068862 A1* | 3/2018 | Terakura | H01L 21/02129 |

FOREIGN PATENT DOCUMENTS

JP  2018-032664  3/2018

* cited by examiner

*Primary Examiner* — Lan Vinh
(74) *Attorney, Agent, or Firm* — IPUSA, PLLC

(57) ABSTRACT

There is provision of an etching method including a step of preparing a substrate over which a boron film or a boron-containing film is formed, a step of supplying a process gas containing chlorine gas, fluorine-containing gas, and hydrogen-containing gas, and a step of etching the boron film or the boron-containing film via a mask using a plasma formed from the process gas.

9 Claims, 5 Drawing Sheets

COMPARATIVE EXAMPLE

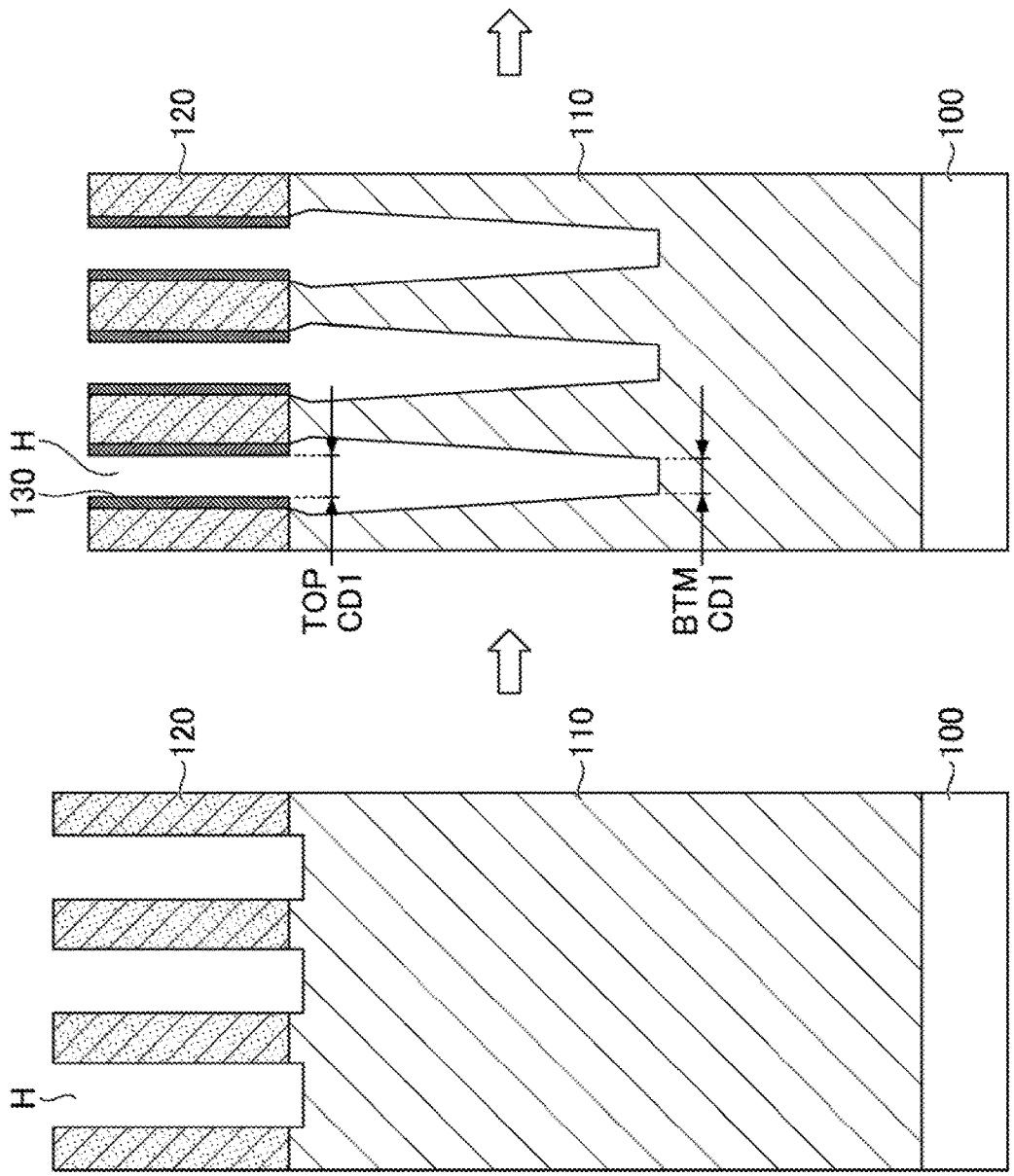

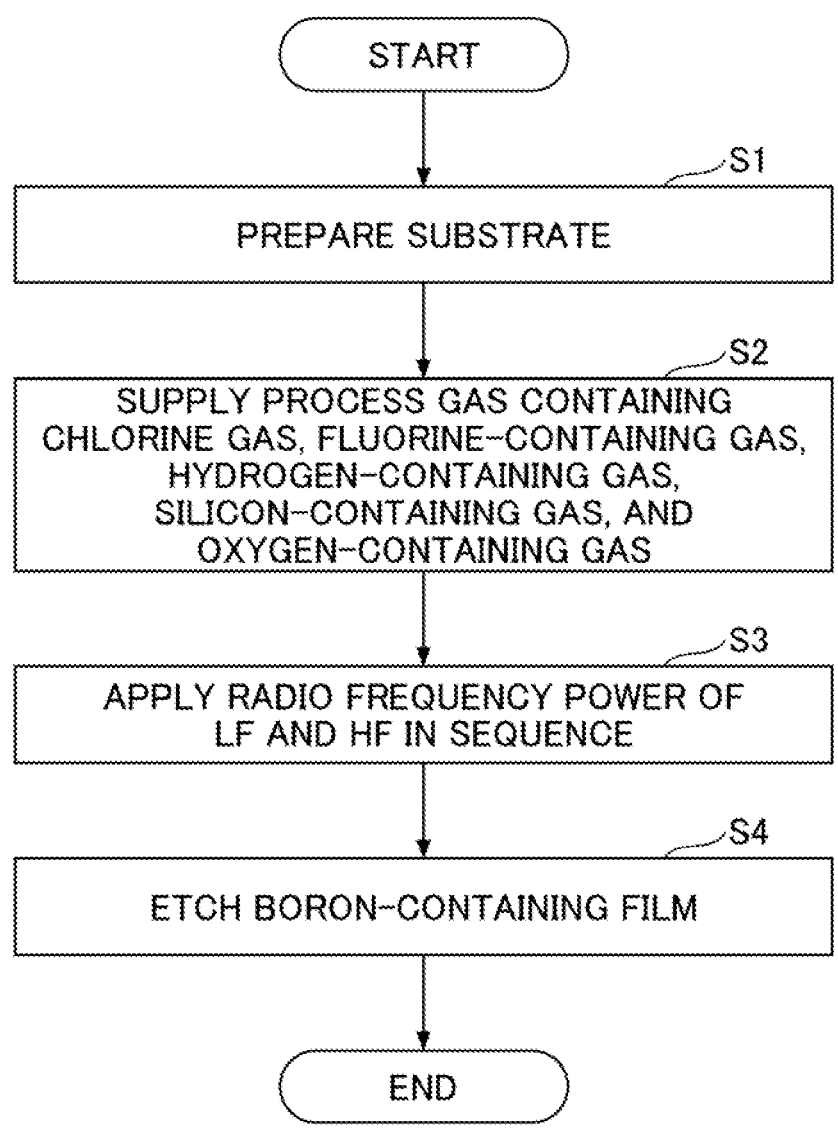

ETCHING METHOD AND SUBSTRATE PROCESSING APPARATUS

CROSS-REFERENCE TO RELATED APPLICATIONS

This patent application is based upon and claims priority to Japanese Patent Application No. 2019-151424 filed on Aug. 21, 2019, the entire contents of which are incorporated herein by reference.

TECHNICAL FIELD

The present disclosure relates to an etching method and a substrate processing apparatus.

BACKGROUND

For example, Patent Document 1 is an etching method for selectively etching a silicon portion with respect to a silicon nitride film and a silicon oxide film in a to-be-processed substrate having a silicon portion, a silicon nitride film, and a silicon oxide film, wherein the silicon portion is etched by supplying a fluorine-containing gas and an inert gas to the to-be-processed substrate with the fluorine-containing gas excited.

RELATED ART DOCUMENT

Patent Document

[Patent Document 1] Japanese Laid-open Patent Application Publication No. 2018-032664

SUMMARY

The present disclosure provides a technique that can increase the verticality of etching of boron or boron-containing films.

According to one aspect of the present disclosure, an etching method is provided. The etching method includes a step of preparing a substrate over which a boron film or a boron-containing film is formed, a step of supplying a process gas containing chlorine gas, fluorine-containing gas, and hydrogen-containing gas, and a step of etching the boron film or the boron-containing film via a mask using a plasma formed from the process gas.

BRIEF DESCRIPTION OF THE DRAWINGS

FIGS. 2A to 2C are diagrams illustrating an example of a result of etching a boron-containing film by a conventional etching method;

FIG. 5 is a flowchart illustrating an example of the etching method according to the embodiment.

DETAILED DESCRIPTION OF EMBODIMENTS

Figure 1:
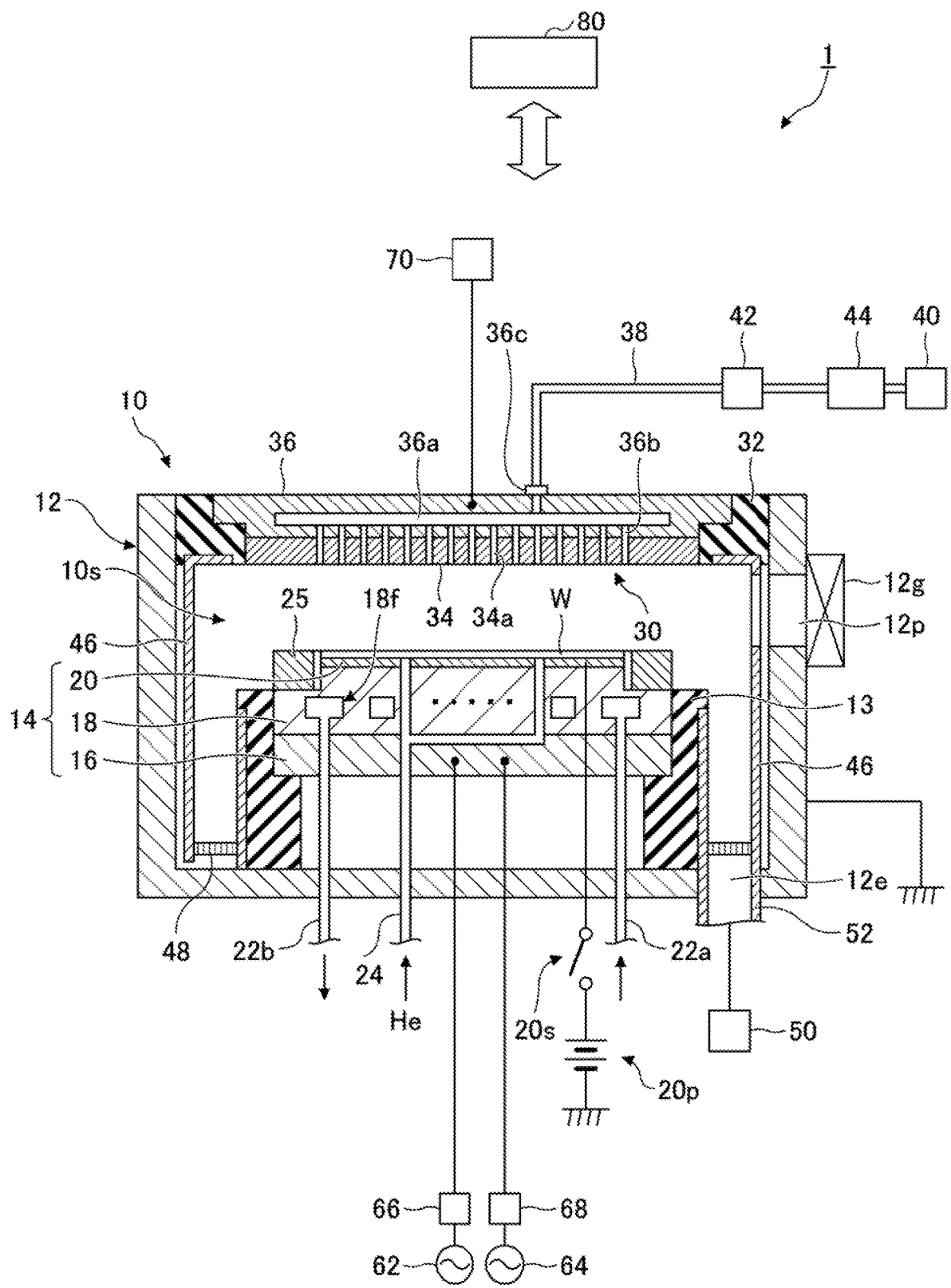
FIG. 1 is a cross-sectional view illustrating an example of a substrate processing apparatus according to an embodiment.

Hereinafter, embodiments for carrying out the present disclosure will be described with reference to the drawings. In each drawing, the same components are indicated by the same reference numerals, and redundant descriptions may be omitted.

[Substrate Processing Apparatus]

A substrate processing apparatus 1 according to an embodiment will be described with reference to FIG. 1. FIG. 1 is a cross-sectional diagram illustrating an example of the substrate processing apparatus 1 according to the embodiment.

The substrate processing apparatus 1 includes a chamber 10. The chamber 10 provides an interior space 10s therein. The chamber 10 includes a chamber body 12. The chamber body 12 has a generally cylindrical shape. The chamber body 12 is formed of, for example, aluminum. A corrosion resistant film is provided on the inner wall of the chamber body 12. The film may be a ceramic such as aluminum oxide, yttrium oxide, and the like.

A passage 12p is formed in the side wall of the chamber body 12. The substrate W is conveyed between the interior space 10s and the exterior of the chamber 10 through the passage 12p. The passage 12p is opened and closed by a gate valve 12g provided along the side wall of the chamber body 12.

A support 13 is provided on the bottom of the chamber body 12. The support 13 is formed of an insulating material. The support 13 has a generally cylindrical shape. The support 13 extends upward from the bottom of the chamber body 12 in the interior space 10s. At the top of the support 13, a stage 14 is provided. The stage 14 is configured to support a substrate W in the interior space 10s.

The stage 14 includes a base 18 and an electrostatic chuck 20. The stage 14 may further include an electrode plate 16. The electrode plate 16 is formed of a conductor, such as aluminum, and has a general disc shape. The base 18 is disposed on the electrode plate 16. The base 18 is formed of a conductor, such as aluminum, and has a general disc shape. The base 18 is electrically connected to the electrode plate 16.

The electrostatic chuck 20 is provided on the base 18. A substrate W is placed on the upper surface of the electrostatic chuck 20. The electrostatic chuck 20 has a body and an electrode. The body of the electrostatic chuck 20 has a general disc shape, and is formed of a dielectric material. The electrode of the electrostatic chuck 20 is a film-like electrode, and is provided within the body of the electrostatic chuck 20. The electrode of the electrostatic chuck 20 is connected to a direct-current (DC) power supply 20p via a switch 20s. When voltage is applied from the DC power supply 20p to the electrode of the electrostatic chuck 20, electrostatic attractive force is generated between the electrostatic chuck 20 and the substrate W. By the electrostatic attractive force, the substrate W is held by the electrostatic chuck 20.

An edge ring 25 is disposed on a periphery of the base 18 to surround the edge of the substrate W. The edge ring 25 may also be referred to as a focus ring. The edge ring 25 improves in-plane uniformity of plasma processing applied to the substrate W. The edge ring 25 may be formed of silicon, silicon carbide, quartz, or the like.

A flow passage 18f is provided within the base 18. From a chiller unit (not illustrated) disposed outside the chamber 10, a heat exchange medium (a refrigerant or a heat medium) for temperature adjustment is supplied to the flow passage 18f via a pipe 22a. The heat exchange medium supplied to the flow passage 18f is returned to the chiller unit via a pipe 22b. By the heat exchange between the heat exchange medium and the base 18, a temperature of the substrate W placed on the electrostatic chuck 20 is regulated.

The substrate processing apparatus 1 is provided with a gas supply line 24. The gas supply line 24 supplies heat transfer gas (e.g., He gas) from a heat transfer gas supply mechanism to a gap between the upper surface of the electrostatic chuck 20 and the bottom surface of the substrate W.

The substrate processing apparatus 1 further includes an upper electrode 30. The upper electrode 30 is provided above the stage 14 so as to face the stage 14. The upper electrode 30 is supported on the top of the chamber body 12 via a member 32. The member 32 is formed of an insulating material. The upper electrode 30 and the member 32 occlude the top opening of the chamber body 12.

The upper electrode 30 may include a top plate 34 and a support 36. The lower surface of the top plate 34 is exposed to the interior space 10s, and defines the interior space 10s. The top plate 34 may be formed of a low resistance conductor or semiconductor with low Joule heat generation. The top plate 34 has multiple gas discharge holes 34a penetrating the top plate 34 in a thickness direction of the top plate 34.

The support 36 removably supports the top plate 34. The support 36 is formed of an electrically conductive material such as aluminum. Inside the support 36, a gas diffusion chamber 36a is provided. The support 36 has multiple gas holes 36b extending downward from the gas diffusion chamber 36a. The multiple gas holes 36b communicate with the multiple gas discharge holes 34a, respectively. A gas inlet 36c is formed in the support 36. The gas inlet 36c is connected to the gas diffusion chamber 36a. A gas supply line 38 is connected to the gas inlet 36c.

Valves 42, flow controllers 44, and gas sources 40 are connected to the gas supply line 38. The gas sources 40, the valves 42, and the flow controllers 44 constitute a gas supply section. Each of the valves 42 may be an open/close valve. Each of the flow controllers 44 is a mass flow controller or a pressure-controlled flow controller. Each of the gas sources 40 is connected to the gas supply line 38 via a corresponding open/close valve of the valves 42 and a corresponding flow controller of the flow controllers 44.

In the substrate processing apparatus 1, a shield 46 is removably provided along the inner wall surface of the chamber body 12 and the outer circumference of the support 13. The shield 46 prevents reaction by-products from adhering to the chamber body 12. The shield 46 is constructed by, for example, forming a corrosion resistant film on the surface of a member formed of aluminum. The corrosion resistant film may be formed from a ceramic such as yttrium oxide.

A baffle plate 48 is provided between the outer side wall of the support 13 and the inner side wall of the chamber body 12. The baffle plate 48 is constructed by, for example, forming a corrosion-resistant film (a film such as yttrium oxide) on the surface of a member formed from aluminum. Multiple through-holes are formed in the baffle plate 48. An exhaust port 12e is provided below the baffle plate 48, at the bottom of the chamber body 12. An exhaust device 50 is connected to the exhaust port 12e via an exhaust pipe 52. The exhaust device 50 includes a pressure regulating valve and a vacuum pump such as a turbomolecular pump.

The substrate processing apparatus 1 includes a first radio frequency power supply 62 and a second radio frequency power supply 64. The first radio frequency power supply 62 is a power source that generates first radio frequency power (hereinafter referred to as "HF power"). The first radio frequency power has a frequency suitable for generating a plasma. The frequency of the first radio frequency power is, for example, a frequency in the range of 27 MHz to 100 MHz. The first radio frequency power supply 62 is connected to the base 18 via a matcher 66 and an electrode plate 16. The matcher 66 includes circuitry for causing the output impedance of the first radio frequency power supply 62 to match impedance of the load side (base 18 side). Note that the first radio frequency power supply 62 may be connected to the upper electrode 30 via the matcher 66. The first radio frequency power supply 62 constitutes an exemplary plasma generator.

The second radio frequency power supply 64 is a power source that generates second radio frequency power (hereinafter referred to as "LF power"). The second radio frequency power has a frequency lower than the frequency of the first radio frequency power. In a case in which the second radio frequency power is used in conjunction with the first radio frequency power, the second radio frequency power is used as radio frequency power for bias voltage to draw ions into the substrate W. The frequency of the second radio frequency power is, for example, a frequency in the range of 400 kHz to 13.56 MHz. The second radio frequency power supply 64 is connected to the base 18 via a matcher 68 and the electrode plate 16. The matcher 68 includes circuitry for causing the output impedance of the second radio frequency power supply 64 to match impedance of the load side (base 18 side).

It should be noted that a plasma may be generated using the second radio frequency power, without using a first radio frequency power. That is, a plasma may be generated using only single radio frequency power. In such a case, the frequency of the second radio frequency power may be greater than 13.56 MHz, for example 40 MHz. In this case, the substrate processing apparatus 1 may not include the first radio frequency power supply 62 and the matcher 66. The second radio frequency power supply 64 constitutes an exemplary plasma generator.

In the substrate processing apparatus 1, gas is supplied from the gas supply section to the interior space 10s to generate a plasma. Also, as the first radio frequency power and/or the second radio frequency power is supplied, a radio frequency electric field is generated between the upper electrode 30 and the base 18. The generated radio frequency electric field generates a plasma.

The substrate processing apparatus 1 includes a power supply 70. The power supply 70 is connected to the upper electrode 30. The power supply 70 applies voltage to the upper electrode 30 to draw positive ions that exist in the interior space 10s into the top plate 34.

The substrate processing apparatus 1 may further include a controller 80. The controller 80 may be a computer including a processor, a storage device such as a memory, an input device, a display device, an input/output interface of a signal, or the like. The controller 80 controls each part of the substrate processing apparatus 1. In the controller 80, an operator can perform input operations of commands to manage the substrate processing apparatus 1, by using the input device. The controller 80 can also display an operation status of the substrate processing apparatus 1 on the display device. Further, a control program and recipe data are stored in the storage device. The control program is executed by the processor to cause the substrate processing apparatus 1 to perform various processes. The processor executes a control program, and controls each part of the substrate processing apparatus 1 in accordance with the recipe data.

[Conventional Etching Method]

Next, an example of a result of etching a boron-containing film by a conventional etching method using the substrate processing apparatus 1 having the above-described configuration will be described with reference to FIGS. 2A to 2C. Thereafter, an example of a result of etching a boron-containing film by an etching method according to the present embodiment using the substrate processing apparatus 1 will be described with reference to FIGS. 3A and 3B.

In the conventional etching method and the etching method according to the present embodiment described below, as illustrated in FIG. 2A, etching is performed with respect to a substrate, on which a base film 100 is formed, a boron-containing film 110 is formed on the base film 100, and a mask 120 is formed on the boron-containing film 110. The base film 100 may be a silicon-containing film, such as a silicon oxide film ($SiO_2$) or a silicon nitride film (SiN). The boron-containing film 110 is an example of a film to be etched. The film to be etched may be a boron film instead of the boron-containing film 110. In the present embodiment, the boron-containing film 110 is, but is not limited to, a boron-doped silicon film. In the present embodiment, the mask 120 is a silicon oxide film, but is not limited thereto, and may be a silicon-containing film such as a silicon nitride film. The mask 120 may have a pattern of holes H seen from above, but may also have a pattern of grooves.

The boron-containing film 110 is etched through the mask 120 until the base film 100 is exposed, and the holes H (deep holes) are formed in the boron-containing film 110 by etching. The diameter of the opening of the hole H formed on the top surface of the boron-containing film 110 is referred to as "TOP CD". An aspect ratio is a ratio of the thickness of the boron-containing film 110 to the TOP CD of the hole H on the boron-containing film 110 (=thickness of the boron-containing film 110/TOP CD), which is 20 to 30 in this example.

Process conditions in the conventional etching method are as follows.

<Process Conditions>
Pressure: 30 mTorr (4.00 Pa)
HF power: 800 W
LF power: 4500 W
Duty cycle of HF and LF:
　LF Duty=13%,
　HF Duty=50%
Pulse frequency of HF and LF: 2.0 kHz
Gas type: chlorine ($Cl_2$) 150 sccm
Temperature (of electrostatic chuck): 120° C.
Etching time: 240 seconds Prior to a process of etching the boron-containing film 110 under the above-described process conditions, removal of a native oxide film is performed. The removal of the native oxide film is performed for approximately 5 seconds by feeding nitrogen trifluoride ($NF_3$) gas and oxygen ($O_2$) gas into the chamber 10. Thus, the native oxide film on the substrate can be removed.

After the removal of the native oxide film, the controller 80 controlled each part of the substrate processing apparatus 1 in accordance with the above-described process conditions. The controller 80 set the pressure in the chamber 10 to 30 mTorr, set the temperature of the electrostatic chuck 20 to 120° C., supplied chlorine gas into the chamber 10, and applied HF power and LF power to the stage 14. The HF power and the LF power were applied in the order of LF power and HF power, and the HF power and the LF power were applied such that the pulse frequency was 2.0 kHz. Specifically, the LF power was applied at a duty cycle of 13%, while the HF power was turned off. Next, the HF power was applied at a duty cycle of 50%, while the LF power was turned off. The LF power and the HF power were then turned off for the remaining 37% of time. The above-described application of pulse-like (pulsating) electric power was repeated at a frequency of 2.0 kHz.

A shape of the hoe H that is formed as a result of performing the conventional etching method is illustrated in FIG. 2B and FIG. 2C. In the conventional etching method, as illustrated in FIG. 2B, an etching profile of the hole H formed in the boron-containing film 110 becomes thinner toward the bottom of the hole H, and the longitudinal cross-sectional shape of the hole H becomes tapered (first problem).

Further, as illustrated in FIG. 2C, the mask 120 sometimes disappeared before the bottom of the hole H reaches the base film 100, because selectivity to mask when etching the boron-containing film 110 to form the hole H was insufficient (second problem).

The first problem will be described in more detail. The mask 120 formed of a silicon oxide film is difficult to be etched with chlorine gas. Further, as illustrated in FIG. 2B, reaction by-products 130, which are generated when etching the boron-containing film 110, adhere to the side wall of the mask 120 of a silicon oxide film easily. In a case in which the boron-containing film 110 is etched with a single gas of chlorine gas, reaction by-products 130 of $BCl_xO_y$ and $SiCl_xO_y$ adhere to the mask 120, and the reaction by-products 130 are deposited on the mask 120. As a result, as illustrated in FIG. 2B, the TOP CD of the hole H formed on the boron-containing film 110 (note that the TOP CD of the hole H formed by the conventional etching method is denoted by "TOP CD1") is reduced by the reaction by-products 130. Note that the diameter of the bottom surface of the hole H formed in the boron-containing film 110 is referred to as "BTM CD", and the BTM CD formed in the boron-containing film 110 by the conventional etching method is denoted by "BTM CD1".

In contrast, the boron-containing film 110 is easily etched with chlorine gas, and, as illustrated in FIG. 2B, the reaction by-products 130 generated during etching do not easily adhere to the side wall of the boron-containing film 110 beneath the mask 120. As the reason for this, it is thought that bonding between the reaction by-products 130 and the silicon oxide film of the mask 120 acts predominantly, while bonding between the reaction by-products 130 and the boron-containing film 110 does not act predominantly.

Because of the aforementioned reason, it is difficult to form the reaction by-products 130 as a protective film on the side surface of the boron-containing film 110 beneath the mask 120. Thus, etching of the boron-containing film 110 beneath the mask 120 is encouraged in a lateral direction. As a result, as illustrated in FIG. 2B, the side surface of the boron-containing film 110 beneath the mask 120 was etched, and bowing occurred, in which the hole H expands outward.

To resolve the problem, it is considered to add fluorine-based (F-based) gas to the chlorine gas to expand the TOP CD1 of the hole H formed in the boron-containing film 110. In this case, the TOP CD1 of the boron-containing film 110 expands, but the mask 120 formed of a silicon oxide film is etched. Thus, the pattern of the mask 120 is destroyed, and selectivity to mask decreases.

This is caused by the low chemical reactivity of the boron-containing film 110. Thus, when chlorine gas is used, the BTM CD1 of the hole H formed on the boron-containing film 110 is not easily widened. On the other hand, if a highly reactive gas, such as a fluorine-based gas, is added to the chlorine gas, chemical reaction of the boron-containing film 110 is accelerated, but it is assumed that the mask 120 is also etched and that the mask 120 is destroyed.

Accordingly, in the etching method according to the present embodiment described below, the above-described problems are solved by performing etching using a mixed gas in which a specific gas is added to chlorine gas. Hereinafter, the etching method according to the present embodiment will be described.

[Etching Method According to the Embodiment]

Figure 3B:
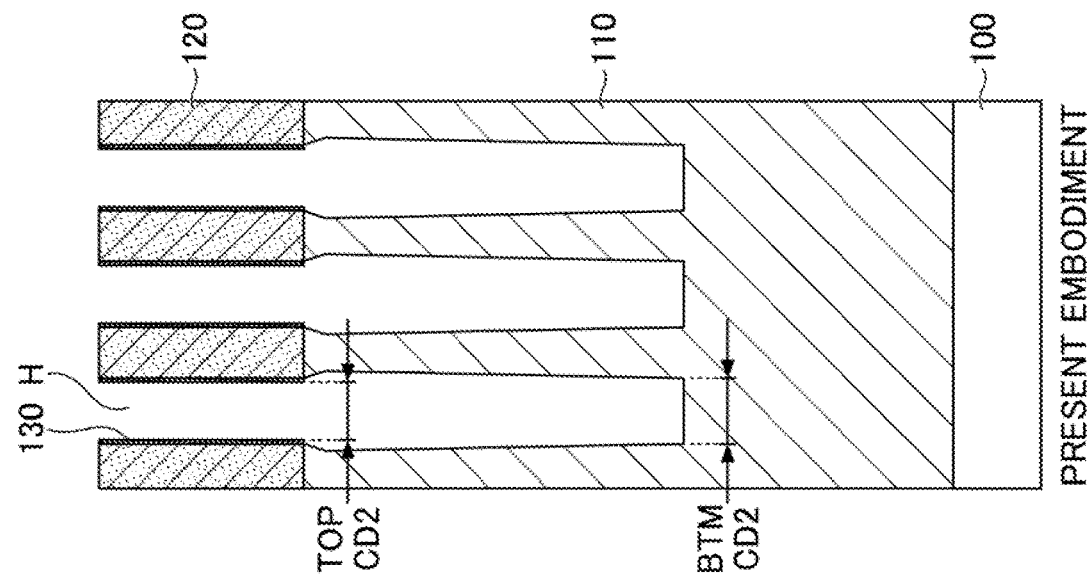
FIGS. 3A and 3B are diagrams illustrating a result of etching the boron-containing film by an etching method according to the embodiment.
Figure 3A:
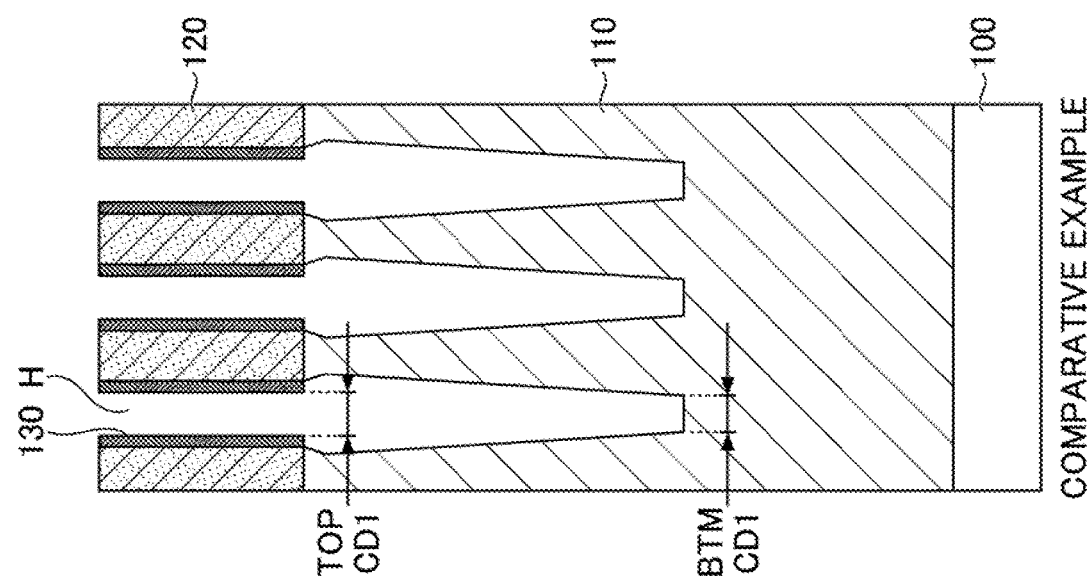

A shape of the hole H formed in the boron-containing film by the etching method according to the present embodiment using the substrate processing apparatus 1 will be described with reference to FIGS. 3A and 3B. FIG. 3A is the same diagram as FIG. 2B and is presented as a comparative example. FIG. 3A illustrates an example of the result of etching films on the substrate illustrated in FIG. 2A by the conventional etching method. FIG. 3B illustrates an example of the result in a case in which etching was performed to the substrate of FIG. 2A by the etching method according to the present embodiment.

The process conditions of the etching method according to the present embodiment are the same as those of the conventional etching method, except for types of gas in the process gas. The types of gas are as follows.

<Process Conditions>

Gas type: chlorine ($Cl_2$) 150 sccm, nitrogen trifluoride ($NF_3$) 10 sccm, hydrogen ($H_2$) 40 sccm, silicon tetrachloride ($SiCl_4$) 5 sccm, and oxygen ($O_2$) 10 sccm Among the gases in the process gas, nitrogen trifluoride gas is an example of a fluorine-containing gas. The fluorine-containing gas is not limited to nitrogen trifluoride gas, and may be carbon tetrafluoride ($CF_4$) gas. Hydrogen gas is an example of a hydrogen-containing gas, and the hydrogen-containing gas may be hydrogen bromide (HBr) gas. Silicon tetrachloride gas is an example of a silicon-containing gas, and the silicon-containing gas is not limited thereto. The silicon-containing gas may be silicon tetrafluoride ($SiF_4$) gas. Oxygen is an example of an oxygen-containing gas, and the oxygen-containing gas is not limited thereto, but may be carbon dioxide ($CO_2$) gas or carbonyl sulfide (COS) gas.

The silicon-containing gas and the oxygen-containing gas may not be contained in the process gas. For example, the process gas may be a mixed gas of chlorine gas, fluorine-containing gas and hydrogen-containing gas, or a gas containing chlorine gas, fluorine-containing gas and hydrogen-containing gas. The process gas may also be a mixed gas of chlorine gas, fluorine-containing gas, hydrogen-containing gas, silicon-containing gas, and oxygen-containing gas, or a gas containing chlorine gas, fluorine-containing gas, hydrogen-containing gas, silicon-containing gas, and oxygen-containing gas.

The etching method according to the present embodiment may also perform a process of removing a native oxide film by supplying a mixture of nitrogen trifluoride ($NF_3$) gas and oxygen ($O_2$) gas into the chamber 10, before the process of etching the boron-containing film 110 under the above-described process conditions.

(Addition of $NF_3/H_2$ and its Effect)

As the result of the etching method according to the present embodiment illustrated in FIG. 3B, the reaction by-products 130 adhering to the mask 120 can be made thinner as compared to the result of the conventional etching method of FIG. 3A. The reason is that, by the addition of nitrogen trifluoride gas and hydrogen gas, the reaction by-products 130 adhering to the mask 120 are etched by reaction with nitrogen trifluoride gas and hydrogen gas, or the reaction by-products 130 are removed by reaction with nitrogen trifluoride gas and hydrogen gas before the reaction by-products 130 adhere to the mask 120. As a result, as illustrated in FIG. 3B, the TOP CD of the hole H formed on the boron-containing film 110 (note that the TOP CD of the hole H formed by the etching method according to the present embodiment is denoted by "TOP CD2") could be controlled such that the TOP CD2 becomes greater than the TOP CD1. Note that the BTM CD that is the CD at the bottom of the hole H formed by the etching method according to the present embodiment is referred to as "BTM CD2".

Accordingly, in the etching method according to the present embodiment, the TOP CD2 could be controlled to be TOP CD2>TOP CD1, and thus the opening of the hole H could be widened. Because the TOP CD2 was controlled not to be narrowed, in the etching of the boron-containing film 110 by the chlorine gas, rectilinear movement of ions incident to the hole H could be ensured, and the BTM CD2 at the bottom of the hole H could be expanded more easily. As a result, the BTM CD2 could be controlled to be BTM CD2>BTM CD1, and the etching profile of the hole H formed on the boron-containing film 110 could be made to be more vertical.

In addition, it is considered that, during etching, hydrogen (H) of hydrogen gas contained in the process gas reacts with boron (B) contained in the reaction by-products 130 of $BCl_xO_y$ that are generated when the boron-containing film 110 is etched, and that the reaction by-products 130 are emitted as compounds such as BH radicals. Therefore, the reaction by-products 130 are less likely to adhere to the side surface of the mask 120 or the side surface of the hole H of the boron-containing film 110. As a result, it is considered that the BTM CD2 of the hole H was more easily widened than the BTM CD1 of the hole H formed by the conventional etching method using a process gas not containing hydrogen gas.

As a secondary effect, controllability of nitrogen trifluoride gas can be improved by fluorine radicals (F radicals) being scavenged. That is, if only nitrogen trifluoride gas is added to chlorine gas, the mask 120 of the silicon oxide film is etched. Thus, it becomes difficult to solve the problem that the shape of the mask 120 is destroyed. On the other hand, in the etching method according to the present embodiment, hydrogen gas is added together with nitrogen trifluoride gas. By adding hydrogen gas, because fluorine (F) reacts with hydrogen (H) to form hydrogen fluoride (HF), F is consumed. As a result, by controlling the flow rate of nitrogen trifluoride gas, an amount of reaction by-products 130 adhering to the side surface of the mask 120 can be easily controlled.

If the reaction by-products 130 adhering to the side surface of the mask 120 are removed completely, no protective film is formed on the mask 120, and the shape of the mask 120 may collapse. In contrast, in the etching method according to the present embodiment, the amount (thickness) of the reaction by-products 130 adhering to the side surface of the mask 120 can be controlled. That is, the TOP CD2 of the boron-containing film 110 can be controlled. This enables control of the BTM CD2, and can increase verticality of the shape of the hole H.

(Addition of $SiCl_4/O_2$ and its Effect)

Figure 4A:
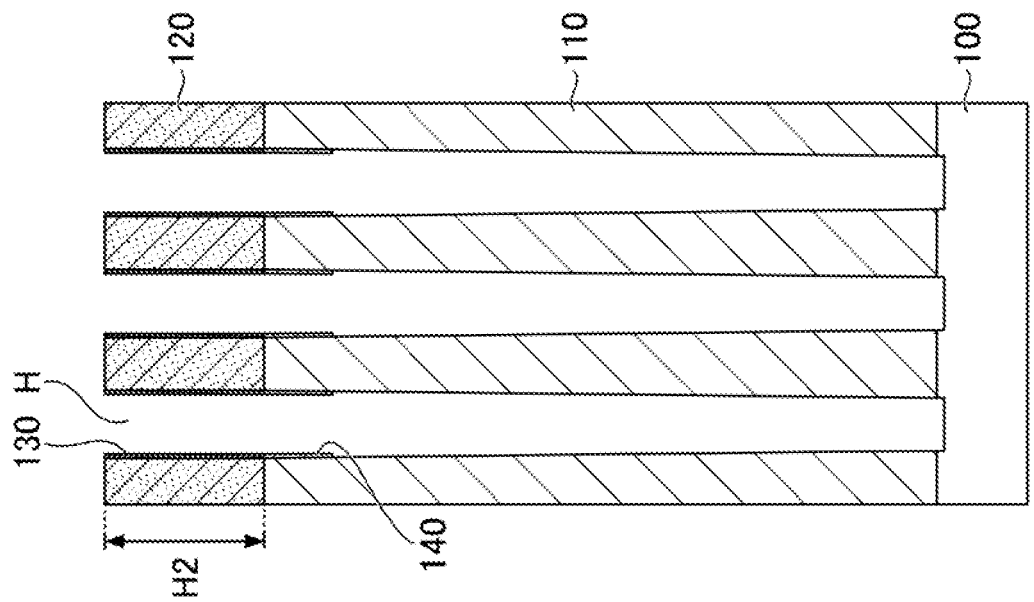
FIGS. 4A and 4B are diagrams each illustrating a result of etching the boron-containing film using a different gas.
Figure 4B:
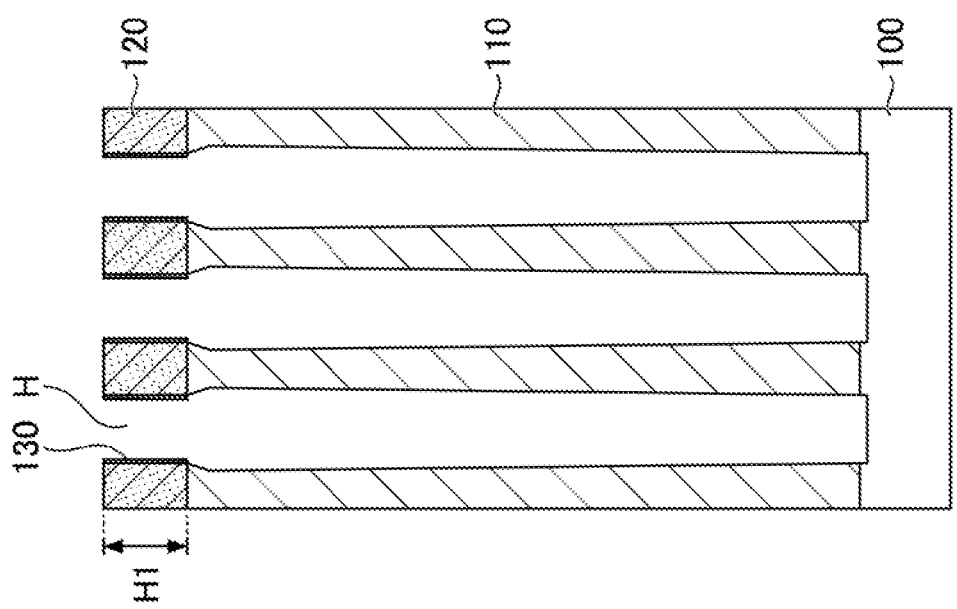

Next, the effect of further adding silicon tetrachloride gas and oxygen gas to the process gas will be described with reference to FIGS. 4A and 4B. FIG. 4A illustrates an example of an etching result in a case in which nitrogen trifluoride gas and hydrogen gas are added and silicon tetrachloride gas and oxygen gas are not added in the etching method according to the present embodiment. FIG. 4B illustrates an example of an etching result in a case in which nitrogen trifluoride gas, hydrogen gas, silicon tetrachloride gas, and oxygen gas are added in the etching method according to the present embodiment.

As illustrated in FIG. 4A, in the case in which nitrogen trifluoride gas and hydrogen gas were added to chlorine gas but silicon tetrachloride gas and oxygen gas were not added, a case in which selectivity with respect to the mask 120 became insufficient occurred. In contrast, in a case in which nitrogen trifluoride gas, hydrogen gas, silicon tetrachloride gas, and oxygen gas are added to chlorine gas, selectivity with respect to the mask 120 can be improved as illustrated in FIG. 4B.

This is because, by further adding silicon tetrachloride gas and oxygen gas to chlorine gas, reaction by-products 130 of $SiCl_xO_y$, adhere to the mask 120 selectively, relative to the boron-containing film 110. As a result, the reaction by-products 130 of $SiCl_xO_y$, could be deposited on the top surface of the mask 120. At the same time, on the side surface of the mask 120, fluorine (F) was consumed by reacting with hydrogen (H) to form hydrogen fluoride (HF), thereby controlling the amount (thickness) of the reaction by-products 130 adhering to the side surface of the mask 120. That is, in the etching method according to the present embodiment, by adding silicon tetrachloride gas and oxygen gas, balance between deposition of the reaction by-products 130 on the mask 120 and etching of the boron-containing film 110 can be accurately controlled. This improves selectivity with respect to the mask 120 while improving verticality of the hole H.

In addition, oxygen gas not involved in the generation of the reaction by-products 130 of $SiCl_xO_y$, is used to oxidize the boron-containing film 110 or to generate the reaction by-products 130 of $BCl_xO_y$, contributing to formation of a protective film on the side wall of the boron-containing film 110. Thus, lateral etching of the boron-containing film 110 is inhibited by the protective film of the reaction by-products 130, thereby allowing the etching shape of the hole H to be more vertical.

When the process gas is supplied in the etching method according to the present embodiment, nitrogen trifluoride gas and hydrogen gas may be supplied concurrently with silicon tetrachloride gas and oxygen gas. Alternatively, from among a set of nitrogen trifluoride gas and hydrogen gas and a set of silicon tetrachloride gas and oxygen gas, one set may be supplied first, and the other set may be supplied later.

[Sequence of Etching Method]

Next, a sequence of steps of the etching method according to the present embodiment will be described with reference to FIG. 5. FIG. 5 is a flowchart illustrating an example of the etching method according to the present embodiment. The etching method according to the present embodiment is controlled by the controller 80 and is performed in the substrate processing apparatus 1.

When the process of FIG. 5 starts, a substrate over which a boron-containing film 110 is formed on a base film 100 and a mask 120 is formed on the boron-containing film 110 is prepared, by loading the substrate into the chamber 10, and by placing the substrate on the stage 14 (step S1).

Next, a process gas containing chlorine gas, fluorine-containing gas, hydrogen-containing gas, silicon-containing gas, and oxygen-containing gas is supplied in the chamber 10 (step S2). Next, LF power and HF power are applied to the stage 14 in this order with their respective predetermined duty cycles (step S3). As a result, the boron-containing film 110 is etched by a plasma formed from the process gas (step S4), and the process ends. Note that a step of removing a native oxide film may be executed before step S2.

As described above, the etching method according to the present embodiment includes a step of preparing a substrate on which a boron film or a boron-containing film is formed, a step of supplying a process gas containing chlorine gas, fluorine-containing gas, and hydrogen-containing gas, and a step of etching the boron film or the boron-containing film via a mask by a plasma formed from the process gas. The above-described etching method can increase verticality of an etching profile of the boron film or the boron-containing film.

Regarding the step of supplying the process gas, the process gas may contain chlorine gas, fluorine-containing gas, hydrogen-containing gas, silicon-containing gas, and oxygen-containing gas. This improves selectivity to mask.

After the boron film or the boron-containing film is etched by the etching method according to the present embodiment, the boron film or the boron-containing film may serve as, for example, a mask of the base film 100, but the function of the boron film or the boron-containing film after etching is not limited thereto.

The etching method and the substrate processing apparatus according to the present embodiment disclosed herein should be considered only as an example in all respects, and should not be restrictive. The above embodiments may be modified and enhanced in various forms without departing from the scope of the appended claims. Matters described in the above embodiments may take other configurations to an extent not inconsistent, and may be combined to an extent not inconsistent.

The substrate processing apparatus according to the present disclosure is applicable to any type of apparatus, such as an atomic layer deposition (ALD) type, a capacitively coupled plasma (CCP) type, an inductively coupled plasma (ICP) type, a radial line slot antenna type (RLSA), an electron cyclotron resonance plasma (ECR) type, and a helicon wave plasma (HWP) type.

Although a plasma processing apparatus has been described as an example of the substrate processing apparatus, the substrate processing apparatus may be a device for etching a substrate, and is not limited to a plasma processing apparatus.

What is claimed is:

1. A method comprising:
   preparing a substrate over which a boron film or a boron-doped silicon film is formed;
   supplying a process gas consisting of chlorine gas, fluorine-containing gas, hydrogen-containing gas, silicon-containing gas, and oxygen-containing gas; and
   etching the boron film or the boron-doped silicon film via a mask using a plasma formed from the process gas.

2. The method according to claim 1, wherein the mask is a silicon-containing film.

3. The method according to claim 1, wherein the plasma is formed by applying pulsating radio frequency power for drawing ions and pulsating radio frequency power for generating the plasma in sequence.

4. The method according to claim 1, the fluorine-containing gas is nitrogen trifluoride ($NF_3$) or carbon tetrafluoride ($CF_4$) gas.

5. The method according to claim 1, the hydrogen-containing gas is hydrogen ($H_2$) or hydrogen bromide (HBr) gas.

6. The method according to claim 1, the silicon-containing gas is silicon tetrachloride ($SiCl_4$) or silicon tetrafluoride ($SiF_4$) gas.

7. The method according to claim 1, the oxygen-containing gas is oxygen ($O_2$), carbon dioxide ($CO_2$), or carbonyl sulfide (COS) gas.

8. The method according to claim 1, the process gas contains chlorine ($Cl_2$), nitrogen trifluoride ($NF_3$), hydrogen ($H_2$), silicon tetrachloride ($SiCl_4$), and oxygen ($O_2$) gas.

9. A substrate processing apparatus comprising:
   a chamber;
   a gas supply section; and
   a controller configured to perform a method including
      preparing a substrate, over which a boron film or boron-doped silicon film is formed, in the chamber;
      supplying a process gas consisting of chlorine gas, fluorine-containing gas, hydrogen-containing gas, silicon-containing gas, and oxygen-containing gas, into the chamber; and
      etching the boron film or the boron-doped silicon film via a mask by a plasma formed from the process gas.

\* \* \* \* \*